US012595561B2

(12) United States Patent
Lee et al.

(10) Patent No.: US 12,595,561 B2
(45) Date of Patent: Apr. 7, 2026

(54) SHOWERHEAD AND SUBSTRATE PROCESSING APPARATUS USING THE SAME

(71) Applicant: ASM IP Holding B.V., Almere (NL)

(72) Inventors: KyungEun Lee, Suwon-si (KR); HaRim Kim, Hwaseong-si (KR); IkDu Nam, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 679 days.

(21) Appl. No.: 17/950,254

(22) Filed: Sep. 22, 2022

(65) Prior Publication Data

US 2023/0099798 A1     Mar. 30, 2023

Related U.S. Application Data

(60) Provisional application No. 63/248,977, filed on Sep. 27, 2021.

(51) Int. Cl.
*C23C 16/455*          (2006.01)
(52) U.S. Cl.
CPC .............................. *C23C 16/45565* (2013.01)

(58) Field of Classification Search
CPC ................................................ C23C 16/45565
See application file for complete search history.

(56) References Cited

U.S. PATENT DOCUMENTS

| | | | |
|---|---|---|---|
| 8,083,853 B2 | 12/2011 | Choi | |
| D913,980 S | 3/2021 | Lee | |
| 2015/0214013 A1* | 7/2015 | Glukhoy | H01J 37/32477 29/527.1 |

* cited by examiner

*Primary Examiner* — Yuechuan Yu
(74) *Attorney, Agent, or Firm* — Snell & Wilmer L.L.P.

(57)          ABSTRACT

A showerhead for supplying a gas includes a showerhead body having an upper surface and a lower surface opposite to the upper surface, and a plurality of through-holes formed in the showerhead body so that the gas passes through from the upper surface toward the lower surface, wherein a size of a cross-sectional area of each through-hole of the plurality of through-holes in the lower surface is the same, while the size of the cross-sectional area of each through-hole in the upper surface increases from a center of the showerhead toward an edge thereof.

20 Claims, 9 Drawing Sheets

DIRECTION OF INCREASING SIZE OF THROUGH-HOLE IN UPPER SURFACE

EXHAUST PORT

| CONVENTIONAL | EXAMPLE 1 | EXAMPLE 2 | EXAMPLE 3 | EXAMPLE 4 |
|---|---|---|---|---|
| 386.6Å/2.6% | 391.8Å/1.98% | 409.2Å/1.0% | 414.4Å/1.6% | 418.6Å/1.7% |

SHOWERHEAD AND SUBSTRATE PROCESSING APPARATUS USING THE SAME

CROSS-REFERENCE TO RELATED APPLICATIONS

This application claims priority to U.S. Provisional Patent Application Ser. No. 63/248,977 filed Sep. 27, 2021 titled SHOWERHEAD AND SUBSTRATE PROCESSING APPARATUS USING THE SAME, the disclosure of which is hereby incorporated by reference in its entirety.

BACKGROUND

1. Field

The present disclosure relates to a substrate processing apparatus, and more particularly, to a showerhead that injects reaction gases to deposit a thin film on a surface of a substrate mounted on a specific position in a reaction chamber, and a substrate processing apparatus using the showerhead.

2. Description of the Related Art

Semiconductor devices or display devices are electronic devices that are fabricated by stacking a plurality of conductive thin films and/or a plurality of insulating thin films on a substrate and constituting the desired electronic circuits therebetween. At this time, in a process of depositing thin films on a surface of the substrate, in order to improve the conformity with a subsequent process and the production yield of the above electronic devices, a source gas, a reaction gas, and the like should be supplied with a uniform amount through a gas supply apparatus and therefore, uniform thin films should be deposited. As the gas supply apparatus for uniformly supplying the reaction gas on the surface of the substrate, a showerhead has been generally developed and used. Typically, a plurality of vertical through-holes are formed in the showerhead, and the through-holes have a cross-sectional area having a uniform size from a center region to an edge region of the showerhead, so that a uniform amount of gas may be supplied across the entire substrate and a uniform thin film may be deposited on the substrate.

However, in the process of depositing thin films on the surface of the substrate, due to the influence of various process variables, such as the substrate processing temperature in a reactor, the substrate processing time, the substrate temperature, the pressure in a reaction space, the supply amount of the reaction gas, the temperature of the reaction gas, the type of the reaction gas, the exhaust direction of gases after a reaction, and the like, there is a limit in improving the thickness uniformity of the deposited thin films and the growth rate of the thin films, in the case of depositing thin films on the substrate using the above-mentioned conventional showerhead.

SUMMARY

The present disclosure provides a showerhead to improve the thickness uniformity of thin films deposited on a substrate and also the growth rate of the thin films to be deposited.

Further, the present disclosure provides a substrate processing apparatus provided with a showerhead according to some embodiments of the present disclosure, to improve the thickness uniformity of thin films deposited on a substrate and also the growth rate of the thin films to be deposited.

Additional aspects will be set forth in part in the description which follows and, in part, will be apparent from the description, or may be learned by practice of the presented embodiments of the disclosure.

According to an aspect of the inventive concept, there is provided a showerhead for supplying a gas including: a showerhead body having an upper surface and a lower surface opposite to the upper surface; and a plurality of through-holes formed in the showerhead body so that the gas passes through from the upper surface toward the lower surface, wherein a size of a cross-sectional area of each through-hole of the plurality of through-holes in the lower surface is the same as each other, while the size of the cross-sectional area of each through-hole in the upper surface increases from a center of the showerhead toward an edge thereof.

In some embodiments, the size of the cross-sectional area of each through-hole of the plurality of through-holes in the upper surface increase linearly from the center of the showerhead toward the edge thereof.

In some embodiments, the showerhead is classified into a central region and at least one external region, the central region having a predetermined radius including the center of the showerhead in which the plurality of through-holes are formed, and the at least one external region arranged in a ring shape consecutively in a radial direction from the outside of the central region in which the plurality of through-holes are formed, and wherein the size of the cross-sectional area of each through-hole in the upper surface in the external region is greater than the size of the cross-sectional area of each through-hole in the upper surface in the central region.

In some embodiments, the size of the cross-sectional area of each through-hole in the upper surface in the central region is the same as each other, and the size of the cross-sectional area of each through-hole in the upper surface in the external region is also the same as each other. In some embodiments, the size of the cross-sectional area of each through-hole in the upper surface in the central region increases from the center of the showerhead toward the edge thereof, and the size of the cross-sectional area of each through-hole in the upper surface in the external region also increases from the center of the showerhead toward the edge thereof.

In some embodiments, the external region includes a first external region surrounding an outer periphery of the central region and a second external region surrounding the outer periphery of the first external region, and the size of the cross-sectional area of each through-hole in the upper surface in the second external region is greater than the size of the cross-sectional area of each through-hole in the upper surface in the first external region. In some embodiments, the size of the cross-sectional area of each through-hole in the upper surface in the external region is greater than the size of the cross-sectional area of each through-hole in the lower surface in the external region.

In some embodiments, the size of the cross-sectional area of each through-hole in the upper surface in the central region is at least the same as the size of the cross-sectional area of each through-hole in the lower surface in the central region. In some embodiments, the size of the cross-sectional area of each through-hole in the external region decreases linearly from the upper surface to the lower surface thereof.

In some embodiments, in the external region, the size of the cross-sectional area of each through-hole decreases step by step, including at least one step from the upper surface toward the lower surface. In some embodiments, in the external region, the size of the cross-sectional area of each through-hole is constant to a predetermined depth from the upper surface of the showerhead body and thereafter decreases linearly from the predetermined depth to the lower surface thereof.

According to an aspect of the inventive concept, there is provided a showerhead for supplying a gas including: a showerhead body having an upper surface and a lower surface opposite to the upper surface; and a plurality of through-holes formed in the showerhead body so that the gas passes through from the upper surface toward the lower surface, wherein a size of a cross-sectional area of each through-hole of the plurality of through-holes in the lower surface is the same as each other, and the size of a volume inside each through-hole of the plurality of through-holes increases from a center of the showerhead toward an edge thereof.

In some embodiments, the size of the volume inside each through-hole of the plurality of through-holes increases linearly from the center of the showerhead toward the edge thereof.

In some embodiments, the showerhead is classified into a central region and at least one external region, the central region having a predetermined radius including the center of the showerhead and in which the plurality of through-holes are formed, and the at least one external region arranged in a ring shape consecutively in a radial direction from the outside of the central region in which the plurality of through-holes are formed, and wherein the size of the volume inside each through-hole in the external region is greater than the size of the volume inside each through-hole in the central region.

In some embodiments, the size of the cross-sectional area of each through-hole in the upper surface in the external region is greater than the size of the cross-sectional area of each through-hole in the upper surface in the central region. In some embodiments, the size of the volume inside each through-hole in the central region is the same as each other, and the size of the volume inside each through-hole in the external region is also the same as each other.

In some embodiments, the external region includes a first external region surrounding an outer periphery of the central region and a second external region surrounding the outer periphery of the first external region, and the size of the volume inside each through-hole in the second external region is greater than the size of the volume inside each through-hole in the first external region. In some embodiments, the external region includes a first external region surrounding an outer periphery of the central region and a second external region surrounding the outer periphery of the first external region, and the size of the cross-sectional area of each through-hole in the upper surface in the second external region is greater than the size of the cross-sectional area of each through-hole in the upper surface in the first external region.

According to an aspect of the inventive concept, there is provided a substrate processing apparatus including: a reaction chamber; a substrate support positioned in the reaction chamber; and a showerhead positioned above the substrate support for supplying a gas to a reaction space that is formed between the substrate support and the showerhead, wherein the showerhead includes a showerhead body having an upper surface and a lower surface opposite to the upper surface; and a plurality of through-holes formed in the showerhead body so that the gas passes through from the upper surface toward the lower surface, wherein a size of a cross-sectional area of each through-hole of the plurality of through-holes in the lower surface is the same as each other, while the size of the cross-sectional area of each through-hole in the upper surface increases from a center of the showerhead toward an edge thereof.

In some embodiments, the size of the volume inside each through-hole of the plurality of through-holes increases from the center of the showerhead toward the edge thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 4 is a schematic vertical cross-sectional view of a showerhead according to example embodiments of the present disclosure;

FIG. 5 is a schematic vertical cross-sectional view of a showerhead according to another example embodiments of the present disclosure;

DETAILED DESCRIPTION

Figure 1:
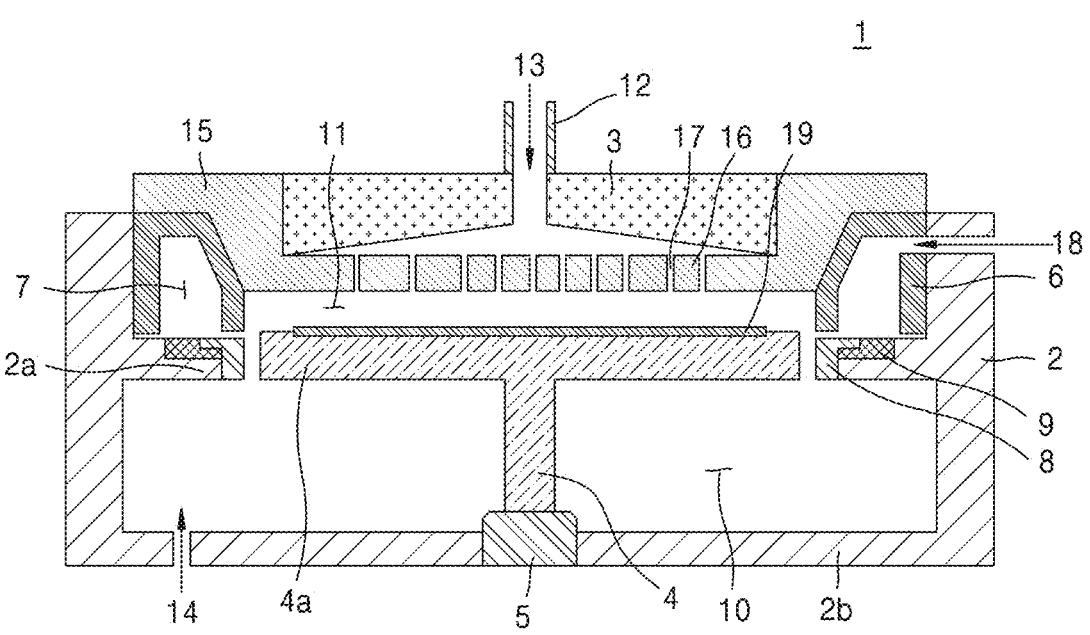
FIG. 1 is a diagram schematically illustrating a substrate processing apparatus according to example embodiments of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings.

Embodiments of the present disclosure are provided to further explain the present disclosure to one of ordinary skill in the art, and the following embodiments may have different forms and the scope of the present disclosure should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any particular order, upper and lower, or importance, but rather are only used to distinguish one member, region, layer, and/or section from another member, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

FIG. 1 is a diagram schematically illustrating a substrate processing apparatus according to example embodiments of the present disclosure.

Referring to FIG. 1, a substrate processing apparatus 1 according to an example embodiment of the present disclosure may include a reactor wall 2, and a gas supply unit provided on an upper side of the reactor wall 2. The gas supply unit may include a gas introduction unit 3 and a gas injection unit 15, which is hereby referred to as a showerhead 15. The gas supply unit may constitute a reaction chamber with a specific space together with the reactor wall 2 while covering the upper side of the reactor wall 2. A substantially central portion of the reaction chamber may be provided with a heating block 4 as a substrate support, and the heating block 4 may be supported by the heating block support unit 5 supported on a bottom surface 2b of the reactor wall 2, wherein the heating block supporting unit 5 may raise and lower the heating block 4 in a vertical direction, move it in a horizontal direction, or tilt it at a certain inclination angle. The heating block 4 may include a horizontal extending portion 4a thereof extending in the horizontal direction, and thus the horizontal extending portion 4a may serve as a substrate support for mounting a substrate 19 to be processed thereon. A lower space 10 may be formed between the reactor wall 2 and the heating block 4 below the heating block 4.

On the other hand, the reactor wall 2 may include a protruding portion 2a thereof that protrudes from an intermediate portion of the reactor wall 2 inward the reaction chamber and along a circumferential direction, and when the heating block 4 is at an elevated position or the heating block 4 is at a position in which the substrate 19 is processed, the protruding portion 2a may be adjacent to the horizontal extending portion 4a of the heating block 4 while surrounding the horizontal extending portion 4a. A stepped portion may be formed near an end of the protruding portion 2a of the reactor wall 2, and a first gas flow control ring 9 and a second gas flow control ring 8 may be mounted on the stepped portion. As shown in FIG. 1, for example, the first gas flow control ring 9 may be mounted on an upper surface of the protruding portion 2a in the form of surrounding the horizontal extending portion 4a of the heating block 4, and the second gas flow control ring 8 is also mounted on an upper surface of the first gas flow control ring 9 in the form of surrounding the horizontal extending portion 4a of the heating block 4. Therefore, an outer surface of the horizontal extending portion 4a of the heating block 4 and an inner surface of the second gas flow control ring 8 may be spaced apart from each other at a certain interval. Such an interval may facilitate raising and lowering of the heating block 4.

On the other hand, an exhaust unit 6 may be mounted on the protruding portion 2a of the reactor wall 2. The exhaust unit 6 may have a cylindrical cross-sectional shape with an open bottom, extending in a circumferential direction along an inner surface of the reactor wall 2. Therefore, an exhaust space 7 that is surrounded by the exhaust unit 6, and the first gas flow control ring 9 and the second gas flow control ring 8 may be formed. A gap may be formed and maintained between a lower end portion of the exhaust unit 6 that faces the second gas flow control ring 8, not attached to the inner surface of the reactor wall 2, and the second gas flow control ring 8, so that exhaust gases processed in the reaction chamber may be entered into the exhaust space 7 through the gap. The exhaust gases to be entered into the exhaust space 7 may be exhausted to the outside through an exhaust port 18 formed on one side of the exhaust unit 6.

As described above, a gas supply unit may be disposed on the upper side of the reaction chamber. The gas supply unit may include the gas introduction unit 3 and the showerhead 15. The gas introduction unit 3 may be provided with a gas inlet 12 through which a process gas such as a source gas, a reaction gas, and a purge gas may flow. A plurality of through-holes 17 may be formed in a disk-shaped showerhead body 16 of the gas injection unit 15, for example, the showerhead 15 and thus the process gas introduced through the gas inlet 12 may be supplied onto the substrate 19 seated on the heating block 4 through the plurality of through-holes 17. An outer edge of the showerhead 15 may be mounted on an upper side of the exhaust unit 6 or the reactor wall 2 to close the reaction chamber. A space surrounded by a lower surface of the showerhead 15, an upper surface of the heating block 4, and an inner surface of the exhaust unit 6 may form a reaction space 11.

Looking at the flow of the process gas 13, the process gas 13 to be introduced into the reaction chamber through the gas inlet 12 may be introduced into the reaction space 11 via the plurality of through-holes 17 formed in the showerhead 15, and then an exhaust gas including the process gas and by-products thereof after a chemical reaction with the substrate 19 may be discharged to the outside through the exhaust space 7 and the exhaust port 18. On the other hand, a filling gas 14 may be supplied into the lower space 10 below the heating block 4 to fill the inside, and the filling gas 14 filled within the lower space 10 may prevent the process gas 13 or exhaust gases that are exhausted from the reaction space 11 to the exhaust space 7, from penetrating into the lower space 10 through the gap between the heating block 4 and the second gas flow control ring 8.

Figure 2A:
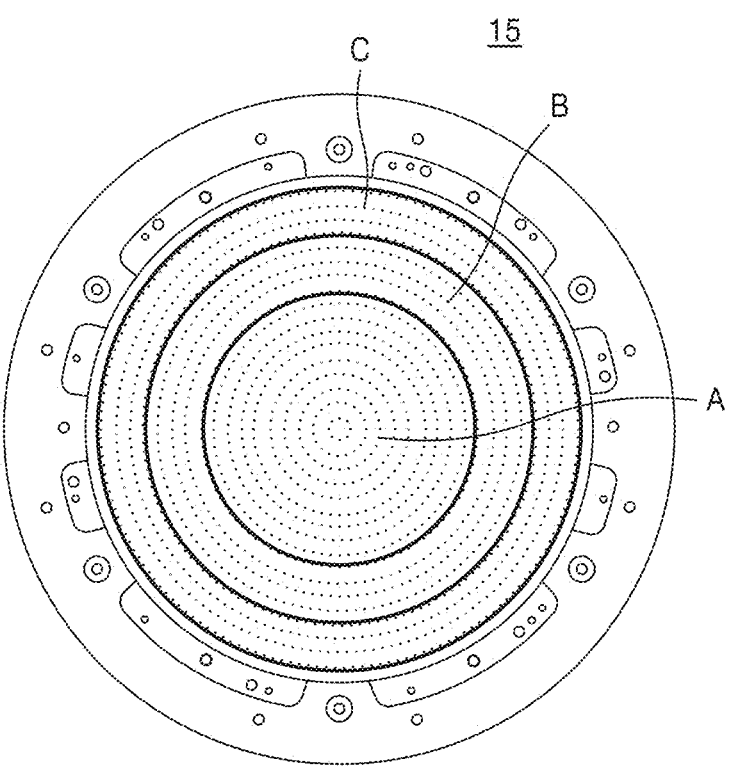
FIG. 2A is a plan view schematically illustrating a showerhead according to example embodiments of the present disclosure.
Figure 2B:
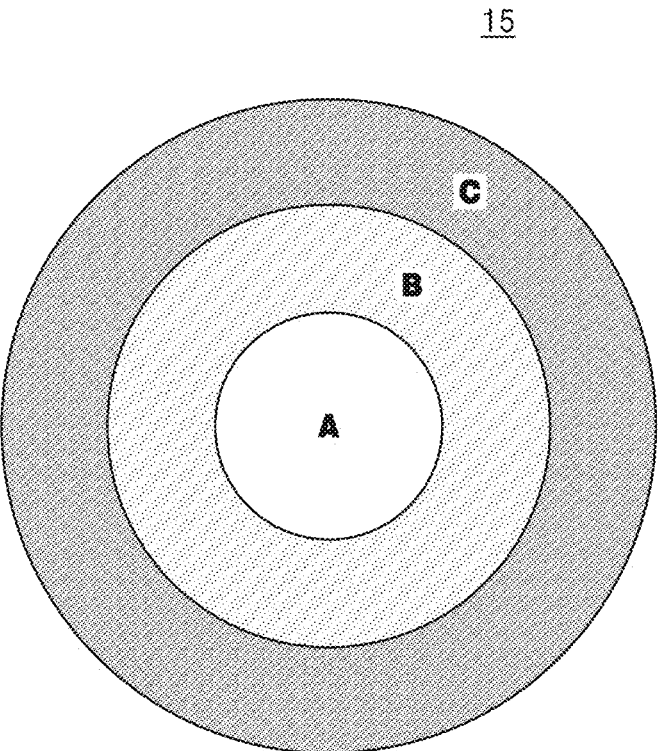
FIG. 2B is a schematic conceptual view of the shower head of FIG. 2A to explain the configuration of the showerhead according to example embodiments of the present disclosure.

FIG. 2A is a plan view schematically illustrating the showerhead 15 according to example embodiments of the present disclosure. FIG. 2B is a schematic conceptual view of the shower head of FIG. 2A to explain the configuration of the showerhead according to example embodiments of the present disclosure. Referring to FIGS. 2A and 2B together with FIG. 1, the showerhead 15 may include a through-hole region where the plurality of through-holes 17 are formed on a central region of the showerhead 15 and an outer extension region extending in the circumferential direction and surrounding the through-hole region where the through-holes are not formed, wherein the outer extension region is mounted on the upper side of the reactor wall 2 or the exhaust unit 6 to cover the upper side of the reaction chamber.

As shown in FIG. 2A, in the showerhead according to example embodiments of the present disclosure, sub-through-hole groups each having a ring shape may be sequentially arranged radially outward from a center of the showerhead 15. As used herein, the term "sub-through-hole group" may be defined as a group of a plurality of through-holes to be formed in the showerhead body 16 and arranged consecutively along the circumferential direction, with a substantially equal radius from the center of the showerhead 15. Therefore, a plurality of through-holes may be formed in one sub-through-hole group, and the number of through-holes included in each of the sub-through-hole group is not particularly limited. Specifically, as shown in FIG. 2A, for example, 9 sub-through-hole groups may be formed in a central region A of the showerhead 15 from the center of the showerhead 15 toward an edge thereof. The number of through-holes 17 included in each sub-through-hole group may be different from each other, and when the interval between adjacent through-holes 17 in one sub-through-hole group is constant for all the sub-through-hole groups, the number of through-holes included in each sub-through-hole group may increase from the center of the showerhead 15 toward the edge thereof.

On the other hand, the term "super-through-hole group" may be defined by grouping the plurality of sub-through-hole groups that are arranged from the center of the showerhead 15 radially outward. As used herein, the super-through-hole group may be referred to as a group in which some of the plurality of sub-through-hole groups radially adjacent to each other are grouped. That is, the plurality of sub-through-hole groups may be included in one super-through-hole group. For example, as shown in FIG. 2A, 9 sub-through-hole groups may be arranged in the central region A, and all the through-holes included in the central region A may be grouped within one super-through-hole group. Further, all the through-holes included in a first external region B (in other term, an intermediate region B) may be grouped within another super-through-hole group. In addition, all the through-holes included in a second external region C (in other term, an edge region C) may be grouped within the other super-through-hole group.

On the other hand, the sub-through-hole groups may be arranged while maintaining the same interval between adjacent sub-through-hole groups in the radial direction, but the present disclosure is not limited thereto, the sub-through-holes groups may be sequentially arranged with different intervals between adjacent sub-through-hole groups in the radial direction. Meanwhile, the plurality of sub-through-hole groups in each super-through-hole group may be arranged while maintaining the same interval between adjacent sub-through-hole groups in the radial direction, but the interval between radially adjacent sub-through-hole groups in one super-through-hole group may be different from the interval between radially adjacent sub-through-hole groups in another super-through-hole group. Meanwhile, the through-holes 17 in each sub-through-hole group may be arranged at regular intervals between adjacent through-holes 17 along the circumferential direction, or may be arranged at different intervals.

Figure 3:
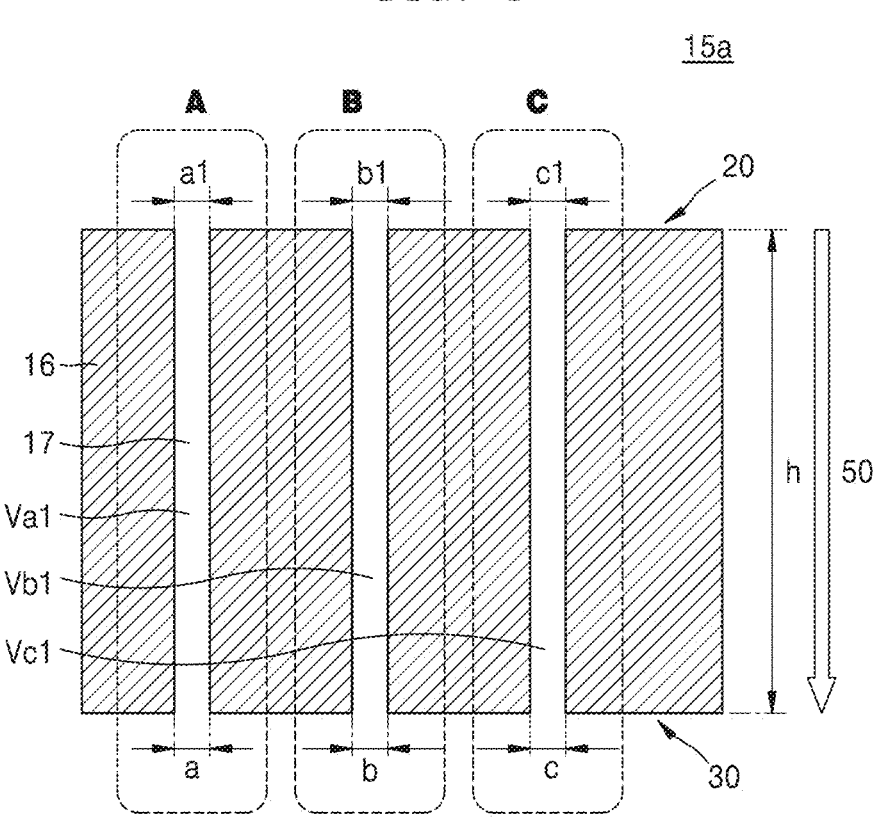
FIG. 3 is a schematic vertical cross-sectional view of a conventional showerhead for comparing with a showerhead according to example embodiments of the present disclosure.

FIG. 3 is a schematic vertical cross-sectional view of a conventional showerhead 15a for comparing with a showerhead according to example embodiments of the present disclosure. Referring to FIG. 3 together with FIG. 2B, vertical cross-sectional views of representative through-holes 17 among the plurality of the through-holes 17 that are formed in the showerhead body 16 in each of the central region A are shown, and the first external region B and the second external region C of the showerhead 15a are adjacently illustrated for the convenience of comparison. An arrow 50 represents the flow direction of a gas, and the gas introduced through the gas introduction unit 3 may be supplied into the reaction space 11 from an upper surface 20 to a lower surface 30 of the showerhead 15a through the through-hole 17.

Referring to FIG. 3, cross-sectional diameters of the through-holes 17 in each of the central region A, the first external region B, and the second external region C of the showerhead 15a may be 'a', 'b', and 'c' in the lower surface 30 and 'a1', 'b1', and 'c1' in the upper surface 20, respectively. Here, a=b=c, and a1=b1=c1, and each through-hole 17 may have a cylindrical shape, so that sizes of the cross-sectional area of the through-holes 17 in each of the central region A, the first external region B, and the second external region C of the showerhead 15a may be the same. In addition, each through-hole 17 may have the cylindrical shape with the same diameter from the upper surface 20 to the lower surface 30, so that the size of the volume within each through-hole 17 formed in each of the central region A, the first external region B, and the second external region C of the showerhead 15a may also be the same (i.e., Va1=Vb1=Vc1). Therefore, the flow rate of the gas passing through the through-holes 17 formed in each of the central region A, the first external region B, and the second external region C of the showerhead 15a may be the same for each through-hole 17.

On the other hand, referring to FIG. 3 together with FIG. 2A, in the conventional showerhead 15a, each through-hole 17 formed in each sub-through-hole group formed within the super-through-hole groups, such as the central region A, the first external region B, and the second external region C of the showerhead 15a may have the same diameter of the cross-section for each through-hole 17, so that the size of the cross-sectional area of each through-hole 17 in the lower surface 30 and upper surface 20 may also be respectively the same as each other and the size of the volume within each through-hole 17 may also be the same as each other.

Figure 4:
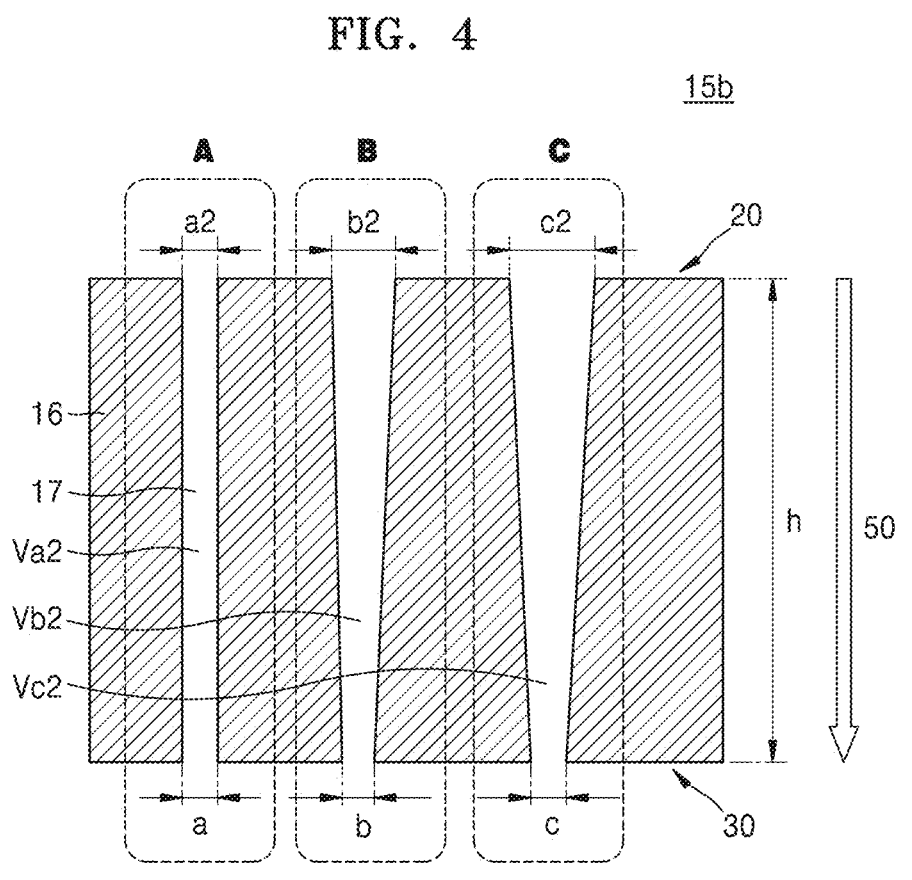

FIG. 4 is a schematic vertical cross-sectional view of a showerhead according to example embodiments of the present disclosure.

Referring to FIG. 4, cross-sectional diameters of the through-holes 17 in each of the central region A, the first external region B, and the second external region C of a showerhead 15b may be 'a', 'b', and 'c' in the lower surface 30 and 'a2', 'b2', and 'c2' in the upper surface 20, respectively. Here, cross-sectional diameters of the through-holes 17 formed in each of the central region A, the first external region B, and the second external region C of the showerhead 15b may be the same as each other in the lower surface 30 (i.e., a=b=c). As shown in FIG. 1, when the RF power is supplied to the showerhead 15 to perform a plasma process for the substrate 19 in the reaction space 11 above the substrate 19, and when the size of the through-hole 17 in the lower surface 30 of the showerhead 15 is large, an electric discharge may occur around the through-hole 17 and arching may also occur near an edge of the through-hole 17, so that the size of cross-section of the through-hole 17 in the lower surface 30 is preferably relatively small and uniform over the lower surface 30 of the showerhead 15.

Here, cross-sectional diameters of the through-holes 17 formed in each of the central region A, the first external region B, and the second external region C of the showerhead 15b may be different from each other in the upper surface 20. FIG. 4 indicates that cross-sectional diameters at the upper surface 20 of the through-holes 17 formed in each of the central region A, the first external region B, and the second external region C of the showerhead 15b, may increase linearly from the center of the showerhead 15b toward the edge thereof (i.e., a2<b2<c2).

As used herein, the phrase "the cross-sectional diameter increases linearly" may mean that the cross-sectional diameters at the upper surface 20 of the through-holes 17 representatively formed in each of the central region A, the first external region B, and the second external region C of the showerhead 15b may linearly increase from the center of the showerhead 15b toward the edge thereof, in other words, this may mean that the cross-sectional diameters of the representative through-holes 17 at the upper surface 20 formed in each of the central region A, the first external region B, and the second external region C of the showerhead 15b may increase linearly in units of the super-through-hole group (herein, the cross-sectional diameters of the plurality of through-holes 17 included in each of the central region A, the first external region B, and the second external region C of the showerhead 15b may be the same as each other). In addition, as described with respect to FIG. 2, the phrase "the cross-sectional diameter increases linearly" may further mean that the cross-sectional diameters at the upper surface 20 of the through-holes 17 between radially adjacent sub-through-hole groups within each super-through-holes of the central region A, the first external region B, and the second external region C of the showerhead 15b may linearly increase from the center of the showerhead 15b toward the edge thereof (herein, the cross-sectional diameters of the plurality of through-holes 17 between radially adjacent sub-through-hole groups within each of the central region A, the first external region B, and the second external region C of the showerhead 15b are different from each other). In other words, the cross-sectional diameters of the plurality of through-holes 17 formed in each of the central region A, the first external region B, and the second external region C of the showerhead 15b may be the same as each other within each of the central region A, the first external region B, and the second external region C, but the cross-sectional diameters at the upper surface 20 of the through-holes 17 may increase from the center of the showerhead 15b toward the edge thereof between radially adjacent super-through-hole groups of the central region A, the first external region B, and the second external region C. In some embodiments, the cross-sectional diameters of the plurality of through-holes 17 may be different from each other and may increase from the center of the showerhead 15b toward the edge thereof within each of the central region A, the first external region B, and the second external region C of the showerhead 15b.

In a further embodiment of the present disclosure, the cross-sectional diameters at the upper surface 20 of the through-holes 17 formed in the first external region B may be the same as the cross-sectional diameters at the upper surface 20 of the through-holes 17 formed in the second external region C. Thus, the cross-sectional diameters at the upper surface 20 of the through-holes 17 formed in each of the central region A, the first external region B, and the second external region C of the showerhead 15b, may increase from the center of the showerhead 15b toward the edge thereof (i.e., a2<b2=c2).

On the other hand, the cross-sectional diameters at the lower surface 30 of the through-holes 17 formed in each of the central region A, the first external region B, and the second external region C of the showerhead 15b may be the same as each other (i.e., a=b=c), the cross-sectional diameters at the upper surface 20 of the through-holes 17 formed in each of the central region A, the first external region B, and the second external region C of the showerhead 15b may increase linearly from the center of the showerhead 15b toward the edge thereof (i.e., a2<b2<c2 or a2<b2=c2), and the cross-sectional diameters at the upper surface 20 of the through-holes 17 formed in each of the first external region B and the second external region C may be greater than those of the corresponding through-holes 17 at the lower surface 30 (i.e., b<b2, c<c2). In some embodiments, the cross-sectional diameter a2 at the upper surface 20 of the through-hole 17 in the central region A may be at least the same as the cross-sectional diameter a at the lower surface 30 of the corresponding through-hole 17 (i.e., a≤a2).

Meanwhile, in the above-described description, assuming that the cross-sectional shape of each of the through-holes 17 at the upper surface 20 and the lower surface 30 is a circular shape, the size of the cross-sectional areas of the through-holes 17 at the upper surface 20 and the lower surface 30 are compared to each other based on the cross-sectional diameter of the through-hole 17 in circular shape (see a formula $S=\pi R^2$, where S is the cross-sectional area of a circle and R is a radius of the circle), the cross-sectional shape of each of the through-holes 17 at the upper surface 20 and the lower surface 30 is not limited to the circular shape, and may be formed in various shapes such as elliptical or polygon.

On the other hand, the cross-sectional diameters of the through-holes 17 formed in each of the central region A, the first external region B, and the second external region C of the showerhead 15b may be the same as each other at the lower surface 30, but may be different from each other between the respective regions at the upper surface 20, particularly as described above, may increase from the center of the showerhead 15b toward the edge thereof. In addition, the vertical shape of each through-hole 17 in the first external region B and the second external region C may be a reverse truncated cone shape, in which the size of the cross-sectional area of each through-hole 17 may decrease linearly from the upper surface 20 toward the lower surface

30 of the showerhead 15*b* and also the cross-sectional diameters of the through-holes 17 may increase linearly from the center of the showerhead 15*b* toward the edge thereof, so that the size of the volume inside of each through-hole 17 also increases linearly from the center of the showerhead 15*b* toward the edge thereof (i.e., Va2<Vb2<Vc2). According to the volume formula of a truncated cone, $V=\frac{1}{3}\pi h(r^2+rR+$ (wherein V is the volume of the truncated cone, h is the height of the truncated cone, r is the radius at an upper surface of the truncated cone, i.e. ½a or ½b or ½c in FIG. 4 as the through-holes in the shower-head body in the first external region B and the second external region C thereof show a reverse truncated cone, and R is the radius at a lower surface of the truncated cone, i.e. ½a2 or ½b2 or ½c2 in FIG. 4 as the through-holes in the showerhead body in the first external region B and the second external region C thereof show a reverse truncated cone), when the height h of the truncated cone and the radius r at the upper of the truncated cone are constant, the volume V of the truncated cone may increase as the radius R at the lower surface of the truncated cone increases. That is, for example, based on the first external region B of FIG. 4, when the vertical height h of the through-hole 17 and the radius ½b at the lower surface 30 of the through-hole 17 are constant, the volume inside the through-hole 17 may increase as the radius ½b2 at the upper surface 20 of the through-hole 17 increases. On the other hand, as described above, the cross-sectional area at the upper surface 20 of the through-hole 17 in the central region A may be at least the same as the cross-sectional area at the lower surface 30 of the through-hole 17, and the cross-sectional area at the upper surface 20 of the through-hole 17 in the external regions (i.e., the first external region B and the second external region C) may increase from the center of the showerhead 15 toward the edge thereof, so that the size of the volume inside the through-hole 17 may increase linearly from the center of the showerhead 15 toward the edge thereof (i.e., Va2<Vb2<Vc2).

As used herein, the phrase "the size of the volume increases linearly" may be used as the same or similar concept as the phrase "the cross-sectional diameter increases linearly". That is, as shown in FIG. 4, the phrase "the size of the volume increases linearly" may mean that the volume inside the through-hole 17 representatively formed in each of the central region A, the first external region B, and the second external region C of the showerhead 15*b* may increase linearly from the center of the showerhead 15*b* toward the edge thereof (herein, the volumes of the plurality of through-holes 17 included in each of the central region A, the first external region B, and the second external region C of the showerhead 15*b* are the same within the same super-through-hole group). In addition, as described with respect to FIG. 2, the phrase "the size of the volume increases linearly" may further mean that the volumes inside the through-holes 17 between radially adjacent sub-through-hole groups within each super-through-holes of the central region A, the first external region B, and the second external region C of the showerhead 15*b* may increase linearly from the center of the showerhead 15*b* toward the edge thereof (herein, the volumes inside the plurality of through-holes 17 between radially adjacent sub-through-hole groups within each of the central region A, the first external region B, and the second external region C of the showerhead 15*b* are different from each other) (i.e., Va2<Vb2<Vc2).

In a further embodiment of the present disclosure, the cross-sectional diameters at the upper surface 20 of the through-holes 17 formed in the first external region B may be the same as the cross-sectional diameters at the upper surface 20 of the through-holes 17 formed in the second external region C, and at this time, the volumes inside the through-holes 17 formed in each of the central region A, the first external region B, and the second external region C of the showerhead 15*b* may increase from the center of the showerhead 15*b* toward the edge thereof (i.e., a2<b2=c2 and Va2<Vb2=Vc2).

Therefore, the flow rate of the gas passing through the through-holes 17 formed in each of the central region A, the first external region B, and the second external region C of the showerhead 15*a* may increase from the center of the showerhead 15*b* toward the edge thereof. This means that the flow rate of the gas supplied to the edge region of the reaction space 11 may be greater than that supplied to the central region thereof.

In general, in the prior art, when a thin film is deposited on the substrate in the reaction space by, for example, an atomic layer deposition (ALD) method, the process pressure in the reaction space may be often changed from time to time due to fluctuations in the flow rate of the source gas, the reaction gas, or the purge gas, and also the thickness of the thin film deposited on the substrate may be greater in the edge region of the substrate than in the center region thereof due to various process variables such as an asymmetric exhaust direction. These problems may decrease the thickness uniformity of the thin film across the entire substrate, which results in a subsequent process which is not smooth as it is carried out on a film with uneven film thickness, and the reliability of an electronic device may also decrease.

However, according to some embodiments of the present disclosure, the flow rate of the source gas, the reaction gas, or the purge gas supplied to the edge area of the reaction space 11 may be greater than the central region of the reaction space 11, as a result, as described in detail later, the thickness uniformity of the thin film deposited on the substrate 19 may increase greatly across the entire substrate 19, so that the subsequent process, e.g. another thin film deposition on it, may be smooth and the reliability of electronic devices may also increase. Further, the growth rate of the thin film being deposited as described later may be improved, thereby reducing the process time. The advantages according to the present disclosure will be described in more detail later.

Figure 5:
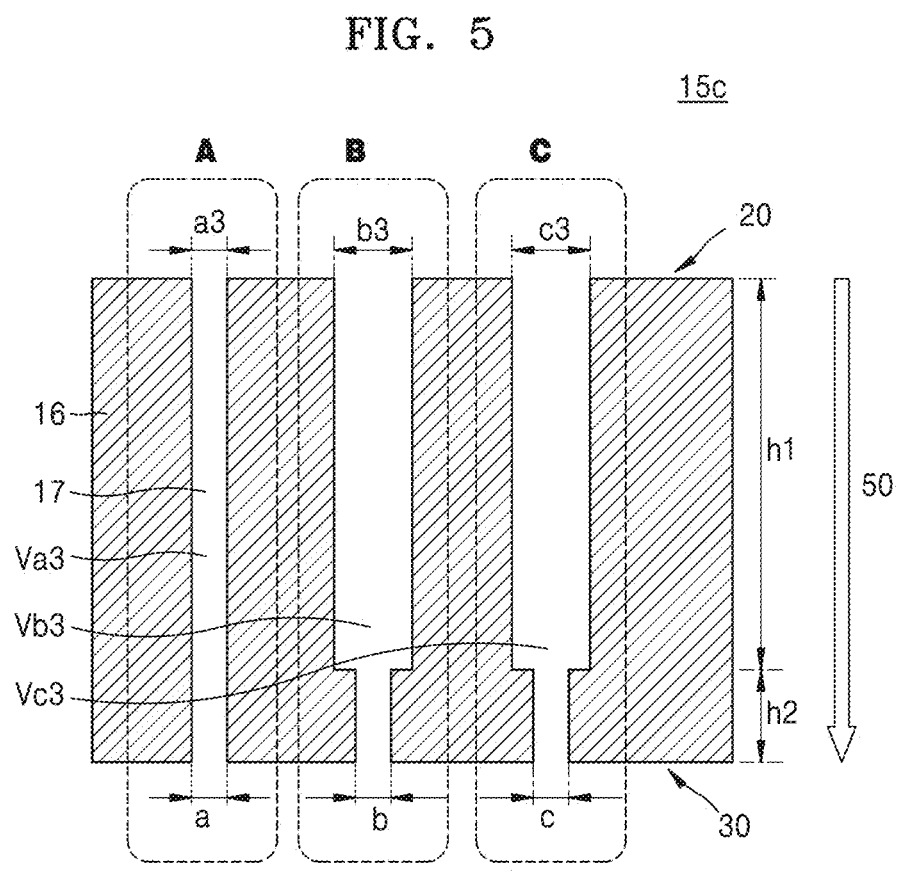

FIG. 5 is a schematic vertical cross-sectional view of a showerhead 15*c* according to another example embodiment of the present disclosure. A description overlapping the description of the showerhead 15*b* according to the embodiments of FIG. 4 will be omitted as far as possible.

Referring to FIG. 5, compared to the showerhead 15*b* of FIG. 4 where the vertical shape of the through-holes 17 is a reverse truncated cone shape, the showerhead 15*c* of FIG. 5 may be different from the showerhead 15*b* in that the vertical shape of the through-hole 17 is a form in which cylinders of different diameters are combined, and a step is formed between vertically adjacent cylinders. In the showerhead 15*c* of FIG. 5, cross-sectional diameters of the through-holes 17 formed in each of the central region A, the first external region B, and the second external region C may be 'a', 'b', and 'c' in the lower surface 30 and 'a3', 'b3', and 'c3' in the upper surface 20, respectively. Here, cross-sectional diameters of the through-holes 17 formed in each of the central region A, the first external region B, and the second external region C of the showerhead 15*c* may be the same as each other in the lower surface 30 (i.e., a=b=c).

On the other hand, the cross-sectional diameters at the upper surface 20 of the through-hole 17 formed in each of the central region A, the first external region B and the second external region C of the showerhead 15c may be different from each other, and may increase linearly from the center of the showerhead 15c toward the edge thereof (i.e., a3<b3<c3). On the other hand, as described above, the phrase "the cross-sectional diameter increase linearly" may mean that when comparing each through-hole 17 representatively formed in each of the central region A, the first external region B, and the second external region C of the showerhead 15c, the cross-sectional diameters at the upper surface 20 of the through-holes 17 may increase linearly from the center of the showerhead 15c toward the edge thereof. In addition, it is not excluded that when comparing the through-holes 17 between radially adjacent sub-through-hole groups within each super-through-hole group of the central region A, the first external region B, and the second external region C, the cross-sectional diameters at the upper surface 20 of the through-holes 17 may increase linearly from the center of the showerhead 15c toward the edge thereof.

In a further embodiment of the present disclosure, the cross-sectional diameters at the upper surface 20 of the through-holes 17 formed in the first external region B may be the same as those in the second external region C (i.e., b3=c3). On the other hand, the cross-sectional diameters of the through-holes 17 formed in each of the first external region B and the second external region C of the showerhead 15c may be greater at the upper surface 20 than at the lower surface 30 (i.e., b<b3, c<c3). On the other hand, the cross-sectional diameter a3 at the upper surface 20 of the through-hole 17 in the central region A may be the same as or greater than the cross-sectional diameter a at the lower surface 30 of the corresponding through-hole 17 (i.e., a=a3, or a<a3). In addition, assuming that the cross-sectional shape of each of the through-holes 17 at the upper surface 20 and the lower surface 30 is the circular shape, the size of the cross-sectional areas of the through-holes 17 at the upper surface 20 and the lower surface 30 are compared to each other based on the cross-sectional diameter of the through-hole 17 in circular shape, but the cross-sectional shape of each of the through-hole 17 may be formed in various shapes such as elliptical or polygon.

On the other hand, the vertical shape of the through-hole 17 in the first external region B and the second external region C may be in the form in which cylinders having different sizes of the cross-sectional area of the through-hole 17 are combined. That is, as shown in FIG. 5, for example, the through-hole 17 in the first external region B may have a combined shape of an upper cylinder that is formed on an upper side of the through-hole 17 with the diameter b3 and the height h1 and a lower cylinder that is formed on a lower side of the through-hole 17 with the diameter b and the height h2. Thus, when compared to the through-hole 17 shown in FIG. 4 in which the diameter of the through-hole 17 of FIG. 4 decreases gradually from the upper surface 20 toward the lower surface 30, the diameter of the through-hole 17 of FIG. 5 may decrease with including at least one step portion in the intermediate portion between the upper surface 20 and the lower surface 30. FIG. 5 illustrates that the through-hole 17 is a form in which two cylinders are combined, but the present disclosure is not limited thereto, the through-hole 17 of the present disclosure may have the form in which three or more cylinders are combined and thus their corresponding step portions are further formed.

The size of the volume inside the through-hole 17 of FIG. 5 may be the sum of the volumes inside the upper cylinder and lower cylinder. According to the volume formula of a cylinder, $V=\pi r^2 h$ (where V is the volume of the cylinder, h is the height of the cylinder, r is the radius of the cylinder), when the height h of the cylinder is constant, the volume V of the cylinder may increase as the radius r of the cylinder increases. As shown in FIG. 5, when comparing the volumes inside the through-hole 17 in the first external region B and the second external region C, the diameters of the through-holes 17 at the lower surface 30 are the same as each other (i.e., b=c), so that the volumes of the lower cylinders thereof are the same as each other, but the diameter c3 at the upper surface 20 of the through-hole 17 in the second external region C may be greater than the diameter b3 in the first external region B (i.e., b3<c3), so that the volume of the upper cylinder in the second external region C may be greater than that in the first external region B and thus, the volume of the entire cylinders in the second external region C may be greater than that in the first external region B. In addition, since the diameter a3 at the upper surface 20 of the through-hole 17 in the central region A is the same as or greater than the diameter a at the lower surface 30 (a=a3, or a<a3), the volume inside the through-hole 17 may increase linearly from the center of the showerhead 15c toward the edge thereof (i.e., Va3<Vb3<Vc3).

On the other hand, the phrase "the volume increase linearly" may mean that when comparing each through-hole 17 representatively formed in each of the central region A, the first external region B, and the second external region C of the showerhead 15c, the volume inside the through-holes 17 may increase linearly from the center of the showerhead 15c toward the edge thereof. In addition, when comparing the through-holes 17 between radially adjacent sub-through-hole groups within each super-through-hole group of the central region A, the first external region B, and the second external region C, the volume inside the through-holes 17 may increase linearly from the center of the showerhead 15c toward the edge thereof.

In a further embodiment of the present disclosure, the cross-sectional diameters at the upper surface 20 of the through-holes 17 formed in the first external region B may be the same as those in the second external region C, and at this time, the volumes inside the through-holes 17 formed in each of the central region A, the first external region B, and the second external region C of the showerhead 15c may increase from the center of the showerhead 15c toward the edge thereof (i.e., a3<b3=c3 and Va3<Vb3=Vc3).

In conclusion, the flow rate of the gas passing through the through-holes 17 formed in each of the central region A, the first external region B, and the second external region C of the showerhead 15c may increase from the center of the showerhead 15c toward the edge thereof. This means that the flow rate of the gas supplied to the edge region of the reaction space 11 may be greater than that supplied to the central region thereof.

Therefore, according to the embodiments of the present invention, as described above, the flow rate of the gas supplied to the edge region of the reaction space 11 may be greater than that supplied to the central region thereof, so that the thickness uniformity of the thin film deposited on the substrate 19 is greatly improved, and the growth rate of the thin film deposited may increase.

Figure 6:
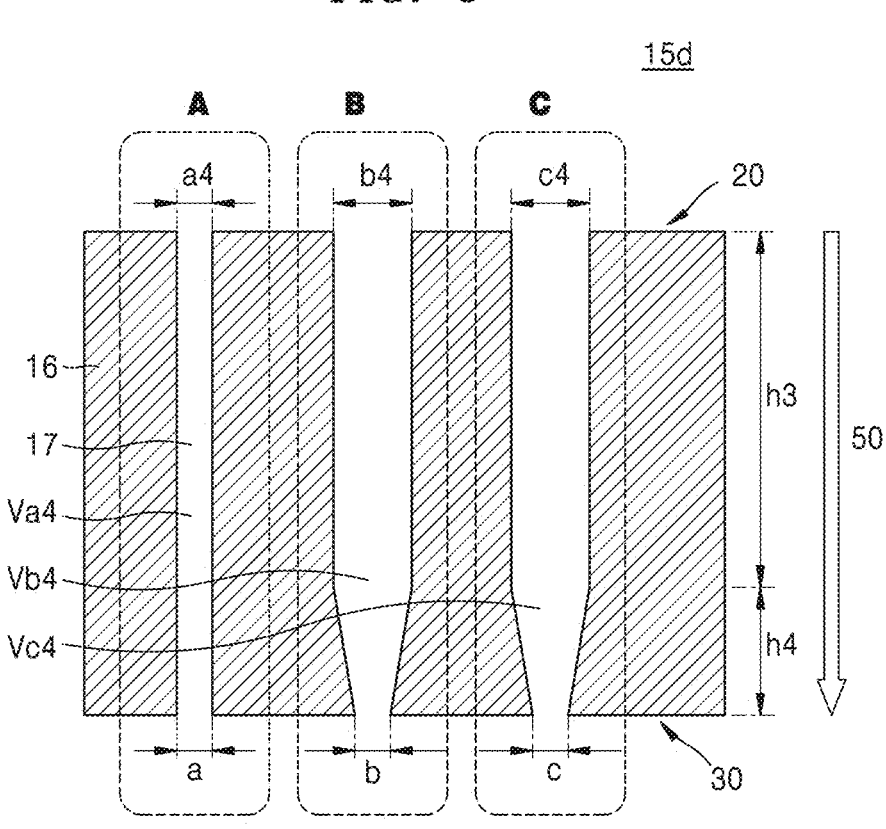
FIG. 6 is a schematic vertical cross-sectional view of a showerhead according to another example embodiments of the present disclosure.

FIG. 6 is a schematic vertical cross-sectional view of a showerhead 15d according to another example embodiments of the present disclosure. A description overlapping the description of the showerheads 15b and 15c according to the embodiments of FIGS. 4 and 5 will be omitted as far as possible.

Referring to FIG. 6, the vertical shape of the through-holes 17 may be a form in which the reverse truncated cone shape of FIG. 4 and the cylindrical shape of FIG. 5 are combined. In the showerhead 15d of FIG. 6, cross-sectional diameters of the through-holes 17 formed in each of the central region A, the first external region B, and the second external region C may be 'a', 'b', and 'c' in the lower surface 30 and 'a4', 'b4', and 'c4' in the upper surface 20, respectively. Here, cross-sectional diameters of the through-holes 17 formed in each of the central region A, the first external region B, and the second external region C of the shower-head 15c may be the same as each other in the lower surface 30 (i.e., a=b=c).

On the other hand, the cross-sectional diameters at the upper surface 20 of the through-holes 17 formed in each of the central region A, the first external region B, and the second external region C of the showerhead 15d, may increase linearly from the center of the showerhead 15d toward the edge thereof (i.e., a4<b4<c4). On the other hand, as described above, the phrase "the cross-sectional diameter increases linearly" may mean the same as in the description of the embodiments of FIGS. 4 and 5.

In a further embodiment of the present disclosure, the cross-sectional diameters at the upper surface 20 of the through-holes 17 formed in the first external region B may be the same as those in the second external region C (i.e., a4<b4=c4). On the other hand, the cross-sectional diameters of the through-holes 17 formed in each of the first external region B and the second external region C of the showerhead 15d may be greater at the upper surface 20 than at the lower surface 30 (i.e., b<b4, c<c4). On the other hand, the cross-sectional diameter a4 at the upper surface 20 of the through-hole 17 in the central region A may be the same as or greater than the cross-sectional diameter a at the lower surface 30 of the corresponding through-hole 17 (i.e., a=a4, or a<a4). In addition, assuming that the cross-sectional shape of each of the through-holes 17 at the upper surface 20 and the lower surface 30 is the circular shape, the size of the cross-sectional areas of the through-holes 17 at the upper surface 20 and the lower surface 30 are compared to each other based on the cross-sectional diameter of the through-hole 17 in circular shape, but the cross-sectional shape of each of the through-hole 17 may be formed in various shapes such as elliptical or polygon.

On the other hand, the vertical shape of the through-hole 17 in the first outer region B and the second outer region C of the showerhead 15d may be in the form in which an upper cylinder and a lower reverse truncated cone are vertically combined. That is, as shown in FIG. 6, for example, the through-hole 17 in the first external region B may have a combined shape of the upper cylinder that are formed on an upper side of the through-hole 17 with the diameter b4 and the height h3 and a lower truncated cone that are formed on a lower side of the through-hole 17 with the diameter b and the height h4. Thus, the diameter of the through-hole 17 shown in FIG. 6 may be constant by the height h3 from the upper surface 20 toward the lower surface 30, but thereafter may decrease linearly to the lower surface 30.

The size of the volume inside the through-hole 17 of FIG. 6 may be the sum of the volumes inside the upper cylinder and the lower reverse truncated cone. Based on the volume formulas of the truncated cone and the cylinder, when comparing the volumes inside the through-holes 17 in the first external region B and the second external region C, since both the diameter of the upper cylinder and the diameter of the lower reverse truncated cone at a point where the upper cylinder and the lower truncated cone meet, may be greater in the second external region C than in the first external region B, the volume inside the through-hole 17 in the second external region C may be greater than in the first external region B. In addition, since the diameter a4 at the upper surface 20 of the through-hole 17 in the central region A is the same as or greater than the diameter a at the lower surface 30 (a=a4, or a<a4), the volume inside the through-hole 17 may increase linearly from the center of the showerhead 15d toward the edge thereof (i.e., Va4<Vb4<Vc4). Meanwhile, as described above, the phrase "the volume increases linearly" may mean that the volumes inside through-holes 17 may increase linearly from the center of the showerhead 15d toward the edge thereof, between the super-through-hole groups, or between radially adjacent sub-through-hole groups within any one of the super-through-hole groups.

In a further embodiment of the present disclosure, the cross-sectional diameters at the upper surface 20 of the through-holes 17 formed in the first external region B may be the same as those in the second external region C, and at this time, the volumes inside the through-holes 17 formed in each of the central region A, the first external region B, and the second external region C of the showerhead 15d may increase from the center of the showerhead 15d toward the edge thereof (i.e., a4<b4=c4 and Va4<Vb4=Vc4).

In conclusion, the flow rate of the gas passing through the through-holes 17 formed in each of the central region A, the first external region B, and the second external region C of the showerhead 15d may increase from the center of the showerhead 15d toward the edge thereof. This means that the flow rate of the gas supplied to the edge region of the reaction space 11 may be greater than that supplied to the central region thereof.

Therefore, according to the embodiments of the present invention, as described above, the flow rate of the gas supplied to the edge region of the reaction space 11 may be greater than that supplied to the central region thereof, so that the thickness uniformity of the thin film to be deposited on the substrate 19 is greatly improved, and the growth rate of the thin film to be deposited may increase.

Embodiments

Hereinafter, experiments to deposit thin films on a substrate by using showerheads, example 1 to example 4, according to embodiments of the present disclosure and a conventional showerhead were respectively performed, and each process conditions are as follows.

$SiO_2$ thin films were deposited on the substrate using a plasma atomic layer deposition method, and in the deposition process, the cross-sectional diameters of the through-holes in the central region A, the first external region B (or the intermediate region) and the second external region C (or the edge region) of each showerhead were different, but the other process conditions, such as atomic layer deposition cycles, types and flow rates of the source gas, reaction gas, and purge gas, the process temperature, the process time, and the plasma conditions, and the like were the same.

The cross-sectional sizes of the through-holes of the showerheads applied to each of the embodiments are shown in Table 1 below. The cross-sectional size of the through-hole was indicated as a cross-sectional diameter for a circle. Here, in the cross-sectional size of the through-hole, the diameter a, was set as 1 mm.

TABLE 1

| classi-fication | Position of through-hole cross-section | Size of through-hole for each region in showerhead (mm) | | |
|---|---|---|---|---|
| | | Central region A | First external region B | Second external region C |
| Conven-tional | Upper surface | a | a | a |
| | Lower surface | a | a | a |
| Example 1 | Upper surface | a | a + 0.1 | a + 0.3 |
| | Lower surface | a | a | a |
| Example 2 | Upper surface | a | a + 0.3 | a + 0.6 |
| | Lower surface | a | a | a |
| Example 3 | Upper surface | a | a + 0.6 | a + 1.1 |
| | Lower surface | a | a | a |
| Example 4 | Upper surface | a − 0.1 | a + 0.4 | a + 0.7 |
| | Lower surface | a − 0.1 | a | a |

Figure 7:
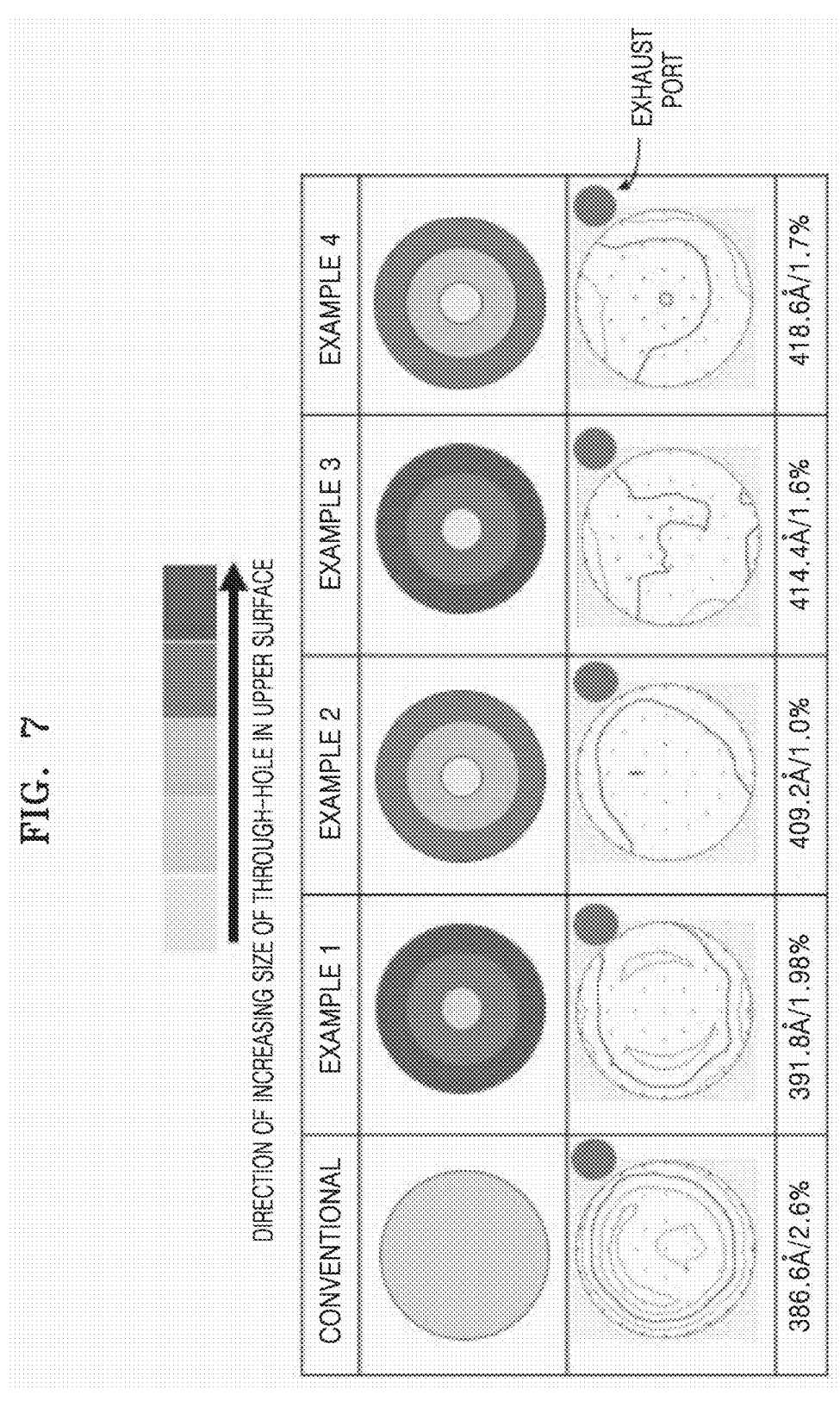
FIG. 7 is a diagram comparing the thickness and the thickness uniformity of deposited thin films for a conventional showerhead and a showerhead according to example embodiments of the present disclosure.

FIG. 7 is a diagram comparing the thickness and the thickness uniformity of thin films deposited by using a conventional showerhead and showerheads according to example embodiments of the present disclosure.

Referring to FIG. 7, for each of the conventional and embodiments of examples 1 to 4, an upper figure indicates that the cross-sectional sizes of the through-holes at the upper surfaces are distinguished by the difference in contrast so that the cross-sectional sizes may be compared relative to the central region A, the first external region B, and the second external region C, wherein the darker color in each regions A, B, and C may indicate a greater cross-sectional size of the through-hole, and a middle figure indicates the thickness uniformity of the deposited thin films over the entire substrate. Circular shapes shown on the upper right corner of the figure indicate positions where the exhaust ports are located, wherein the exhaust ports are asymmetrically arranged on one side of the exhaust unit of the showerhead. A lower figure indicates the thickness of the thin film deposited on the substrate and the thickness uniformity thereof.

The thickness of the deposited thin film is 386.6 Å in the case of conventional showerhead, whereas example 1 is 391.8 Å, example 2 is 409.2 Å, example 3 is 414.4 Å, and example 4 is 418.6 Å, and the thickness uniformity of the deposited thin film is 2.6% in the case of conventional showerhead, whereas example 1 is 1.98%, example 2 is 1.0%, example is 1.6% and example 4 is 1.7%. From the results of FIG. 7, it may be seen that the thickness of the deposited thin film was increased from 386.6 Å in the conventional showerhead to 414.4 Å in example 3 among the embodiments of the present disclosure in which the cross-sectional size of the through-hole is greater in the edge region of the showerhead than the central region thereof, and also the thickness uniformity of the deposited thin film was improved from 2.6% in the conventional showerhead to 1.0% in example 2 of the present disclosure. Therefore, according to the present disclosure, a film growth rate per cycle of the thin film deposited on the substrate and the film uniformity of the thin film may be greatly improved.

Figure 8:
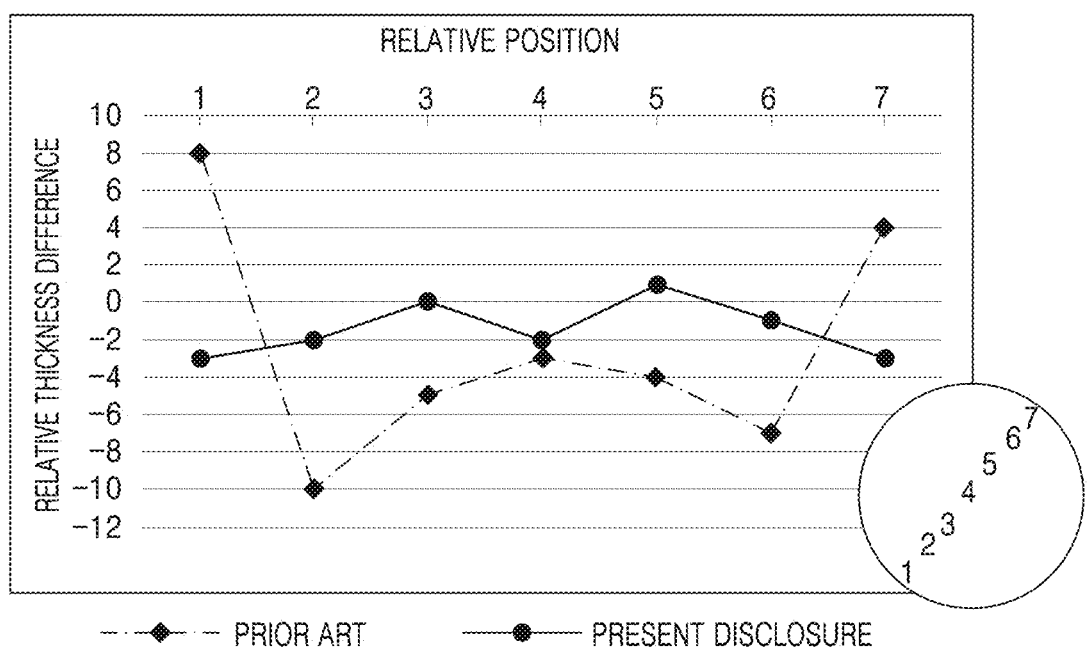
FIG. 8 is a graph relatively comparing the thickness of a thin film formed on a substrate at various positions for a conventional showerhead and a showerhead according to example embodiments of the present disclosure.

FIG. 8 is a graph relatively comparing the thickness of a thin film formed on a substrate at respective positions in the substrate for a conventional showerhead and a showerhead according to example embodiments of the present disclosure. FIG. 8 shows that the result of the thin film deposition process in the reaction chamber where the exhaust port for discharging the exhaust gas after the proceeding of the process from the reaction space to the outside is asymmetrically installed on one side wall of the exhaust space, thereby forming an asymmetric exhaust gas flow therein. A circle shown at a lower right corner of the graph represents the substrate, and the numbers in the circle indicates the positions 1 to 7 in the diameter direction in the substrate, wherein the position 4 represents approximately a center portion of the substrate and positions 1 and 7 represent edge portions of the substrate.

The graph of FIG. 8 shows the relative thickness differences of the thin film at each position 1 to 7 as an increase/decrease value of the thickness, based on the thickness of the thin film at position 3. In the case of the thin film deposited by using the conventional showerhead, the fluctuation of the increase/decrease value is very large between the central region, the intermediate region and the edge region of the substrate, however, in the case of the thin film deposited by using the showerhead according to the embodiments of the present disclosure, the fluctuation of the increase/decrease value is significantly reduced across the central region, the intermediate region and the edge region of the substrate, so that the thickness uniformity of the thin film is very improved.

From the results of FIGS. 7 and 8, by increasing the cross-sectional size of the through-hole at the upper surface in the showerhead from the center of the showerhead toward the edge thereof, or accordingly by increasing the volume inside the through-hole in the showerhead from the center of the showerhead toward the edge thereof, the flow rate of the gas supplied to the reaction space may increase from the central region of the reaction space toward the edge region thereof. As such, a relatively large amount of the gas supplied to the edge region of the reaction space may have a kind of a confinement effect, confining the source gas and the reaction gas supplied to the central region of the reaction space within the reaction space, so that both the growth rate of the thin film deposited on the substrate and the thickness uniformity thereof may be improved. Further, in a purge step of purging the excess source gas or reaction gas in the atomic layer deposition process, more purge gas may be supplied to the edge region than to the central region of the reaction space, so that the thickness of the thin film deposited in the edge region of the substrate may be lowered and thus the thickness uniformity over the substrate may be improved.

Therefore, according to the present invention, for example, even in the reaction chamber in which the exhaust port is asymmetrically installed to form the asymmetric exhaust gas flow, by precisely controlling the cross-sectional size of the through-hole at the upper surface in the showerhead according to the positions of the through-holes in the showerhead, or precisely controlling the size of the volume inside the through-hole according to the positions of the through-holes in the showerhead, the deposition rate of the thin film and the thickness uniformity of the thin film deposited on the substrate may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A showerhead for supplying a gas, comprising: a showerhead body having an upper surface and a lower surface opposite to the upper surface; and a plurality of through-holes formed in the showerhead body so that the gas passes through from the upper surface toward the lower surface, wherein a size of a cross-sectional area of each through-hole of the plurality of through-holes in the lower surface is the same as each other, while the size of the cross-sectional area of each through-hole in the upper surface increases from a center of the showerhead toward an edge thereof, wherein the showerhead is classified into a central region and at least one external region, the central region having a predetermined radius including the center of the showerhead in which a portion of the plurality of through-holes are formed, and the at least one external region arranged in a ring shape consecutively in a radial direction from outside of the central region in which another portion of the plurality of through-holes are formed, and wherein a size of the cross-sectional area of each through-hole in the external region is greater than a size of the cross-sectional area of each through-hole in the upper surface in the central region, and wherein a size of a cross-sectional area of holes in at least a sub-through-hole group of the external region decreases linearly from the upper surface to the lower surface thereof.

2. The showerhead of claim 1, wherein the size of the cross-sectional area of each through-hole of the plurality of through-holes in the at least one external region increases linearly from the center of the showerhead toward the edge thereof.

3. The showerhead of claim 1, wherein each through-hole in the external region is radially substantially equally spaced apart.

4. The showerhead of claim 1, wherein the size of the cross-sectional area of each through-hole in the upper surface in the central region is the same as each other, and the size of the cross-sectional area of each through-hole in the upper surface in the external region is also the same as each other.

5. The showerhead of claim 1, wherein the size of the cross-sectional area of each through-hole in the upper surface in the central region increases from the center of the showerhead toward the edge thereof, and the size of the cross-sectional area of each through-hole in the upper surface in the external region also increases from the center of the showerhead toward the edge thereof.

6. The showerhead of claim 1, wherein the external region includes a first external region surrounding an outer periphery of the central region and a second external region surrounding the outer periphery of the first external region, and the size of the cross-sectional area of each through-hole in the upper surface in the second external region is greater than the size of the cross-sectional area of each through-hole in the upper surface in the first external region.

7. The showerhead of claim 6, wherein the size of the cross-sectional area of each through-hole in the upper surface in the external region is greater than the size of the cross-sectional area of each through-hole in the lower surface in the external region.

8. The showerhead of claim 7, wherein the size of the cross-sectional area of each through-hole in the upper surface in the central region is at least the same as the size of the cross-sectional area of each through-hole in the lower surface in the central region.

9. The showerhead of claim 7, wherein the size of the cross-sectional area of each through-hole in the external region decreases linearly from the upper surface to the lower surface thereof.

10. The showerhead of claim 7, wherein, in the external region, the size of the cross-sectional area of each through-hole decreases step by step, including at least one step from the upper surface toward the lower surface.

11. The showerhead of claim 7, wherein, in the external region, the size of the cross-sectional area of each through-hole is constant to a predetermined depth from the upper surface of the showerhead body and thereafter decreases linearly from the predetermined depth to the lower surface thereof.

12. A showerhead for supplying a gas comprising:
a showerhead body having an upper surface and a lower surface opposite to the upper surface; and
a plurality of through-holes formed in the showerhead body so that the gas passes through from the upper surface toward the lower surface, wherein
a size of a cross-sectional area of each through-hole of the plurality of through-holes in the lower surface is the same as each other, and the size of a volume inside each through-hole of the plurality of through-holes increases from a center of the showerhead toward an edge thereof,
wherein each through-hole comprises a conical section terminating at the lower surface.

13. The showerhead of claim 12, wherein the size of the volume inside each through-hole of the plurality of through-holes increases linearly from the center of the showerhead toward the edge thereof.

14. The showerhead of claim 12, wherein the showerhead is classified into a central region and at least one external region, the central region having a predetermined radius including the center of the showerhead in which a portion of the plurality of through-holes are formed, and the at least one external region arranged in a ring shape consecutively in a radial direction from the outside of the central region in which another portion of the plurality of through-holes are formed, and wherein the size of the volume inside each through-hole in the external region is greater than the size of the volume inside each through-hole in the central region, and wherein a size of a cross-sectional area of holes in at least a sub-through-hole group of the external region decreases linearly from the upper surface to the lower surface thereof.

15. The showerhead of claim 14, wherein the size of the cross-sectional area of each through-hole in the upper surface in the external region is greater than the size of the cross-sectional area of each through-hole in the upper surface in the central region.

16. The showerhead of claim 14, wherein the size of the volume inside each through-hole in the central region is the same as each other, and the size of the volume inside each through-hole in the external region is also the same as each other.

17. The showerhead of claim 14, wherein the external region includes a first external region surrounding an outer periphery of the central region and a second external region surrounding the outer periphery of the first external region, and the size of the volume inside each through-hole in the second external region is greater than the size of the volume inside each through-hole in the first external region.

18. The showerhead of claim 14, wherein the external region includes a first external region surrounding an outer periphery of the central region and a second external region surrounding the outer periphery of the first external region, and the size of the cross-sectional area of each through-hole in the upper surface in the second external region is greater than the size of the cross-sectional area of each through-hole in the upper surface in the first external region.

19. A substrate processing apparatus comprising:

a reaction chamber;

a substrate support positioned in the reaction chamber; and a showerhead positioned above the substrate support for supplying a gas to a reaction space that is formed between the substrate support and the showerhead, wherein the showerhead comprises:

a showerhead body having an upper surface and a lower surface opposite to the upper surface; and a plurality of through-holes formed in the showerhead body so that the gas passes through from the upper surface toward the lower surface, wherein a size of a cross-sectional area of each through-hole of the plurality of through-holes in the lower surface is the same as each other, while the size of the cross-sectional area of each through-hole in the upper surface increases from a center of the showerhead toward an edge thereof, and a cross-sectional dimension of each through-hole in an external region decreases linearly from the upper surface to the lower surface thereof.

20. The substrate processing apparatus of claim 19, wherein the size of the volume inside each through-hole of the plurality of through-holes increases from the center of the showerhead toward the edge thereof.

\* \* \* \* \*